(12) United States Patent
Alpert et al.

(10) Patent No.: US 6,868,533 B2
(45) Date of Patent: Mar. 15, 2005

(54) METHOD AND SYSTEM FOR EXTENDING DELAY AND SLEW METRICS TO RAMP INPUTS

(75) Inventors: Charles Jay Alpert, Round Rock, TX (US); Anirudh Devgan, Austin, TX (US); Chandramouli V. Kashyap, Round Rock, TX (US); Ying Liu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 10/306,603

(22) Filed: Nov. 26, 2002

(65) Prior Publication Data

US 2004/0103379 A1 May 27, 2004

(51) Int. Cl.[7] ............................................. G06F 17/50
(52) U.S. Cl. ......................... 716/4; 716/5; 716/6; 716/1
(58) Field of Search .................................. 716/4, 1, 5, 6

(56) References Cited

U.S. PATENT DOCUMENTS

| | | | | | |
|---|---|---|---|---|---|
| 5,841,672 | A | * | 11/1998 | Spyrou et al. .................. | 716/6 |
| 6,279,142 | B1 | * | 8/2001 | Bowen et al. .................. | 716/5 |
| 6,314,546 | B1 | * | 11/2001 | Muddu .......................... | 716/5 |
| 6,353,917 | B1 | * | 3/2002 | Muddu et al. ................... | 716/6 |
| 6,625,785 | B2 | * | 9/2003 | Chatterjee et al. .............. | 716/4 |
| 6,687,887 | B1 | * | 2/2004 | Teig et al. ..................... | 716/5 |
| 6,718,529 | B1 | * | 4/2004 | Iwanishi ....................... | 716/6 |
| 6,721,929 | B2 | * | 4/2004 | Li et al. ....................... | 716/6 |
| 2004/0049749 | A1 | * | 3/2004 | Croix .......................... | 716/4 |

\* cited by examiner

Primary Examiner—Vuthe Siek
Assistant Examiner—Magid Y. Dimyan
(74) Attorney, Agent, or Firm—Casimer K. Salys; Jack V. Musgrove

(57) ABSTRACT

A method of determining a circuit response (such as delay or slew) from a ramp input of an RC circuit calculates two circuit response parameters using a given circuit response metric based on a step input for the RC circuit, and extends the circuit response metric to a ramp input of the RC circuit by combining the first and second circuit response parameters to yield an estimated ramp response. The novel technique is based on the use of probability distribution functions and cumulative distribution functions to characterize the impulse response of the RC circuit, and the calculating steps derive the first and second circuit response parameters from such statistical distribution functions. In particular, the calculating steps may use a standard deviation or a mean of a probability distribution function corresponding to the circuit response parameter. In one application, the invention is used to estimate delay response for the ramp input of the RC circuit. In another application, the invention is used to estimate output slew for the ramp input of the RC circuit. The invention may be used to extend any valid delay or slew metric.

24 Claims, 2 Drawing Sheets

(a) Saturated Ramp and its PDF (b) Output Ramp Response and its PDF

METHOD AND SYSTEM FOR EXTENDING DELAY AND SLEW METRICS TO RAMP INPUTS

BACKGROUND OF THE INVENTION

1. Field of the Invention

The present invention generally relates to standards of measurement (metrics) for characterizing features of electrical circuits, and more particularly to a method and system which extend delay and slew metrics to ramp inputs for resistive-capacitive (RC) networks, such as those in an integrated circuit.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cells types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip.

An IC chip is fabricated by first conceiving the logical circuit description, and then converting that logical description into a physical description, or geometric layout. This process is usually carried out using a "netlist," which is a record of all of the nets, or interconnections, between the cell pins. An electronic design automation (EDA) system typically receives one or more high level behavioral descriptions of an IC device (e.g., in HDL languages like VHDL, Verilog, etc.), and translates this high level design language description into netlists of various levels of abstraction. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Faster performance and predictability of responses are elements of interest in circuit designs. As process technology scales to the sub-micron regime, interconnect delays increasingly dominate gate delays. Consequently, physical design optimization tools such as floorplanning, placement, and routing are becoming more "timing-driven" than the previous generation of tools. For such a tool to be effective, it must be able to efficiently compute interconnect delay since several million delay calculations are required to optimize a design.

In certain types of circuits, delays exist based on circuit topology and circuit components. Delays are particularly acute in circuits having resistive and capacitive elements, or RC circuits, as they are called in the art. A schematic diagram showing a generalized RC circuit is shown in FIG. 1. Circuit designers continually search for efficient techniques for accurate estimation of these delays, while determining the particular circuit's response to a load. In particular, circuit designers want to be able to calculate reliable delay information when designing the circuit. To this end, several prior art metrics (i.e., computational methods) have been developed.

The Elmore delay metric, which calculates the first moment of the impulse response, is the most widely applied and simplest interconnect delay metric that still captures some amount of metal resistance effects. The Elmore metric provides an upper bound on delay given any input waveform because the RC circuit impulse response is unimodal and positively skewed. The Elmore delay metric is commonly utilized for performance optimization tasks such as floorplanning, placement, buffer insertion, wire sizing in part and global routing. The widespread use of the Elmore delay metric is due to its closed form expression, fast computation speed, and fidelity with respect to simulation. Closed form delay equations, such as Elmore delay metric, are certainly preferable due to both efficiency and ease of implementation, as long as they are sufficiently accurate. Despite its wide usage, the Elmore delay metric is known to be extremely inaccurate at times because it ignores the resistive shielding of downstream capacitance.

Several of the other traditional metrics are known to be more accurate but are somewhat CPU intensive or difficult to implement. For example, moment matching via asymptotic waveform evaluation (AWE, implemented in an interconnect analysis called RICE) is very accurate but computationally expensive for use within a tight optimization loop. Two-pole variants of AWE are considerably faster and recognized to be more accurate than the Elmore delay metric, but are still relatively expensive, as nonlinear solution methods such as Newton-Raphson iterations need to be run to solve the transcendental equation. The metric commonly referred to as PRIMO fits the moments of the impulse response to probability density functions by utilizing a table lookup operation. The h-gamma metric (which subsumes PRIMO) avoids time-shifting the distribution functions and matches the moments to the circuit's homogenous response. The gamma solution also requires a lookup table which is not trivial to build. The scaled Elmore delay metric shifts the Elmore approximation and the error, but does not change the relative delay error problem. Another closed form RC delay metric is described in U.S. Pat. No. 6,434,729, which calculates two moments of impulse response for an RC circuit, and computes a delay value for each node of the circuit based on these two moments. Each node is analyzed to determine if the delay at the given node is at a desired optimization condition.

In almost all of these works, the delay metric assumes a step excitation. In any practical application, the interconnect is driven by a non-linear device and the driving-point waveform is not a step. It is common practice for conventional timing analyzers to replace the non-linear driver by an ideal voltage source generating a saturated ramp signal that has the same 10–90 transition time as the original waveform. Thus, any practical delay metric should be able to handle non-zero input slew (slew generally refers to the signal transition time). The H-gamma method adds a third dimension to the two-dimensional lookup table used for computing step delay. While being accurate, this method requires a carefully constructed table which is made harder by the fact that input slews can vary over a wide range, especially during the initial stages of design. For methods which compute delay directly as a function of moments, either through a lookup-table or an explicit formula, a form of "moment massaging" (PRIMO) is used to handle non-step inputs. The impulse response moments are modified to account for the non-zero input slews and these modified moments are used in the original step formula. The advantage of this approach is that the delay metric remains a closed-form formula even for ramp inputs. However, the formula is only valid for very fast input slews and has large errors for even moderately slow inputs.

In light of the inherent drawbacks with using the various metrics currently available for measuring delays and slew in ramp inputs, it would be desirable to devise an improved method for extending any delay metric derived for a step input into a delay metric for a ramp input for RC trees that is valid over all input slews, to provide greater reliability and accuracy in computing delays in a RC circuit of any topology. It would be further advantageous if the method had such improved effectiveness while not adding computational complexity.

SUMMARY OF THE INVENTION

It is therefore one object of the present invention to provide an improved method of measuring delay in a resistive-capacitive (RC) network.

It is another object of the present invention to provide a method of measuring delay for ramp inputs that is usable for a wide range of possible input slews.

It is yet another object of the present invention to provide a technique for generally extending any delay and slew metric to ramp inputs.

The foregoing objects are achieved in a method of determining a circuit response from a ramp input of an RC circuit, generally comprising the steps of calculating a first circuit response parameter using a given circuit response metric based on a step input for the RC circuit, calculating a second circuit response parameter using the circuit response metric based on a step input for the RC circuit, and extending the circuit response metric to the ramp input of the RC circuit by combining the first and second circuit response parameters to yield an estimated ramp response. The novel technique is based on the use of probability distribution functions and cumulative distribution functions to characterize the impulse response of the RC circuit, and the calculating steps derive the first and second circuit response parameters from such statistical distribution functions. In particular, the calculating steps may use a standard deviation or a mean of a probability distribution function corresponding to the circuit response parameter.

In one application, the invention is used to estimate delay response for the ramp input of the RC circuit. The first circuit response parameter is a mean value for delay step response $\mu(S)$, and the second circuit response parameter is a median value for delay step response M(S). The estimated delay response may be derived according to the formula $$D(R)=(1-\alpha)\mu(S)+\alpha M(S),$$

where $\alpha$ is a constant based on the standard deviations of the delay step response and an input waveform.

In another application, the invention is used to estimate output slew for the ramp input of the RC circuit. The first circuit response parameter is step slew, and the second circuit response parameter is an input slew. The estimated output slew may be derived according to the formula $$\text{Slew}(R)=\sqrt{\text{Slew}^2(S)+\text{Slew}^2(I)}.$$

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
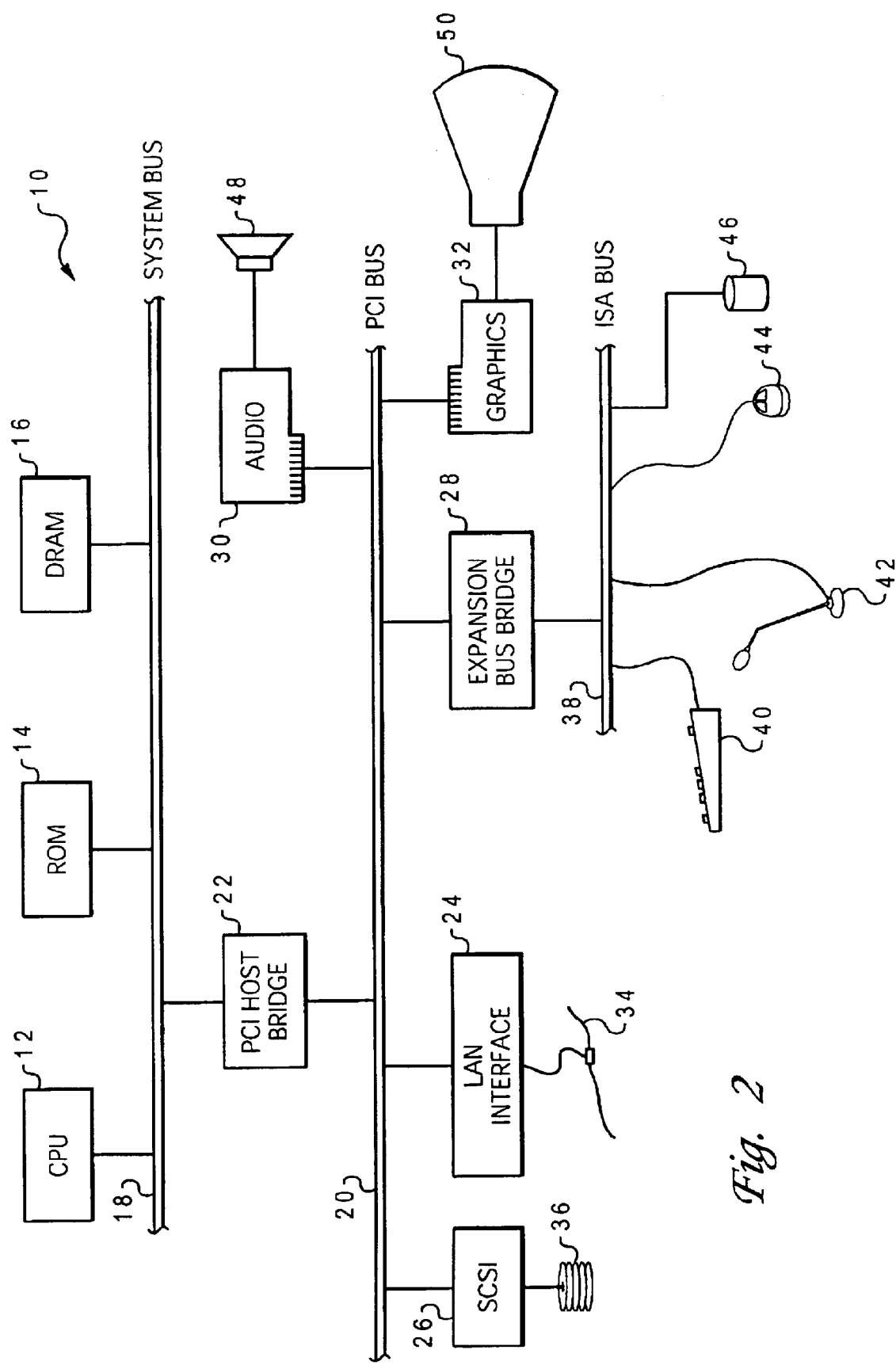
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36 (storage media), those skilled in the art will appreciate that the invention can be embodied in a program product utilizing other computer-readable media, including transmission media. In one embodiment, the computation steps of the invention may be implemented as program code using a programming language, such as C++.

Computer system 10 carries out program instructions for electronic design automation (EDA) in the design of an integrated circuit, and in particular uses a novel and very efficient (inexpensive) technique to accurately analyze delays in a resistive-capacitive (RC) network. Accordingly, the program may include conventional aspects of various EDA tools and analyzers, and these details will become apparent to those skilled in the art upon reference to this disclosure.

In the exemplary embodiment, computer system 10 is programmed to extend delay and slew metrics derived for a step input into metrics for a ramp input that are valid over all input slews. The invention is used to analyze RC circuits, such as the generalized circuit shown in FIG. 1. The ease with which the invention is implemented permits a designer to efficiently analyze multiple design topologies to obtain the best or most efficient topology of a circuit. The invention thus finds applicability in determining the best path to route wires/interconnects within the circuit, the optimum placement of logic blocks within the circuit, appropriate sizing of wires used within the circuit, etc.

Figure 1:
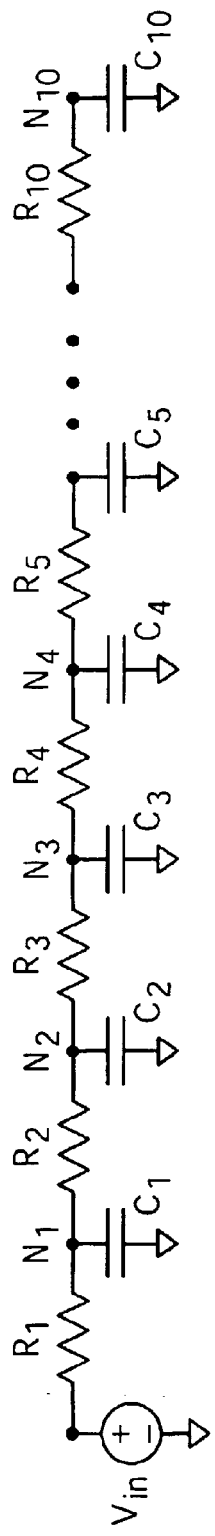
FIG. 1 is a schematic diagram of a generalized resistive-capacitive (RC) circuit which may be analyzed according to the present invention.
Figure 3:
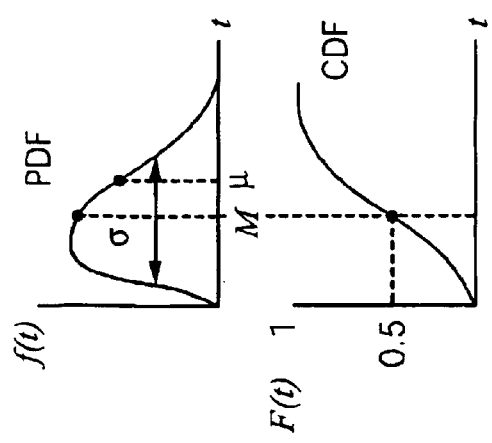
FIG. 3 is a set of two graphs, of a probability distribution function (PDF) and a related cumulative distribution function (CDF), for a random variable t, which can be used to represent the impulse response and step response of an RC circuit such as that shown in FIG. 1.

The novel technique described herein is referred to as a probability distribution function extension for ramp inputs, or PERI. In order to better understand this technique, it is useful to review the relevant connections between probability theory and circuit theory. FIG. 3 depicts a unimodal probability distribution function (PDF) f(t) of a random variable t, and its integral F(t), called the cumulative distribution function (CDF). The mean of f(t) is denoted by $\mu$ and is marked in the figure. Also marked as the 50% point or median M, and the standard deviation $\sigma$. It can be shown that the impulse response h(t) at a node of an RC tree, such as that shown in FIG. 1, is a probability distribution function, and the integral of the impulse response y(t), which is the step response, is a corresponding cumulative distribution function.

The moments of the circuit are given by the equation $$m_k = (-1)^k/k! \int t^k h(t) dt$$

and can be computed efficiently by, e.g., path tracing as is known in the art. The Elmore delay, which is the mean $\mu$ of h(t) is given by $-m_1$, i.e., the first moment of the impulse response. The standard deviation $\sigma$ of h(t) is given by the square root of the second central moment $\mu_2$ of the PDF. The central moments can be expressed as functions of the circuit moments, e.g., $\mu_2 = 2 m_2 - m_1^2$ and $\mu_3 = -6 m_3 + 6 m_1 m_2 - 2 m_1^3$. Hence, the standard deviation is given by the equation $$\sigma = \sqrt{\mu_2} = \sqrt{2 m_2 - m_1^2}.$$

Figure 4:
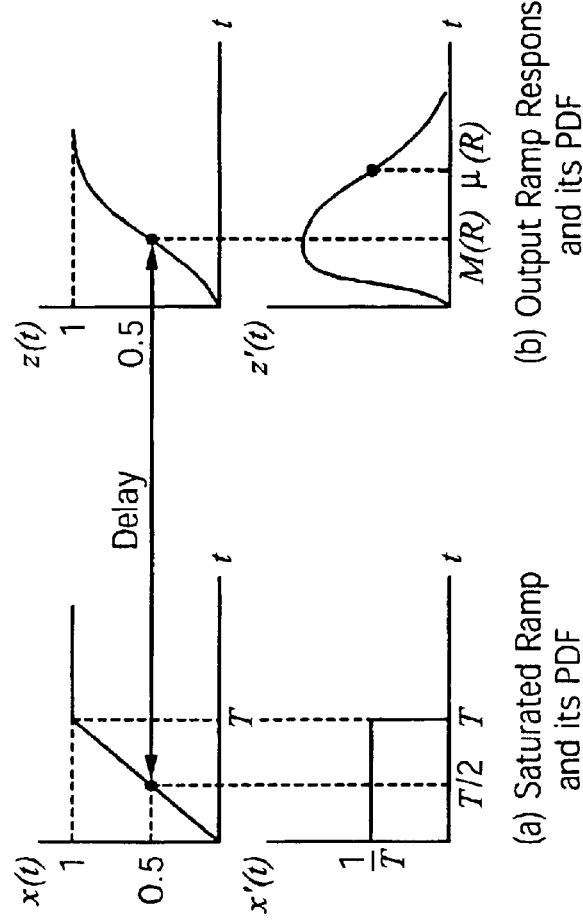
FIG. 4 is a set of four graphs, illustrating a ramp input and its corresponding output response for an RC circuit such as that shown in FIG. 1, and the respective PDFs of the ramp input and output response.

Referring now to FIG. 4, when an input waveform x(t) is applied to an RC circuit, the corresponding circuit response at the output z(t) is given by the convolution of the input waveform with the impulse response, i.e., z(t)=x(t)·h(t), where · is the convolution operator. The derivatives x'(t) and z'(t) are both PDFs since x(t) and z(t) are both CDFs. It is a property of the convolution operation that z'(t)=x'(t)·h(t). This property can be interpreted as the convolution of two PDFs to yield the PDF at the output node. In the following technique, S refers to the step response, I refers to the input waveform, and R refers to the output ramp response from convolving S and I. When referring to a property of a particular PDF, a functional notation is used to specify the given PDF, e.g., $\mu(S)$ is the mean of the step response, and $\sigma(r)$ is the standard deviation of the ramp output response.

The novel PERI technique derives from the concept in probability theory that when two mutually independent PDFs are convolved, both the means and the central moments add. For the present application, this means that:

$$\mu(R) = \mu(S) + \mu(I),$$

$$\mu_2(R) = \mu_2(S) + \mu_2(I), \text{ and}$$

$$\mu_3(R) = \mu_3(S) + \mu_3(I).$$

In addition, as a direct result of equation given above for standard deviation, it can be shown that the sum of the squares of the standard deviations add:

$$\sigma^2(R) = \sigma^2(S) + \sigma^2(I).$$

It is conventional practice to measure delay as the time difference between when the output crosses the 50% point and the time when the input crosses the 50% point. Thus, the delay due to a step input is given by the median M (as in FIG. 3) of the step response, or M(S). Assuming that a delay metric for M(S) is given, e.g., via D2M or h-gamma, the objective of the present invention is to find an accurate estimate for the median M(R) of the ramp output response. The estimated delay D under a ramp input is thus given by D(R)=M(R)−M(I). For example, one might assume that the input waveform is a ramp input with slope T, as shown in FIG. 4 (though PERI can be applied to any symmetric input waveform with known mean and standard deviation). The PDF of this waveform is a uniform distribution with mean $\mu(I)=T/2$ and standard deviation $\sigma(I)=T/\sqrt{12}$. Thus, the delay of the output ramp is as shown in FIG. 4. To derive a PERI, we use the principle of the skewness, i.e., the relative difference between the mean and the median. One specific measure of skewness which may be used, the Pearson skewness, is defined as $\mu_3^2/\sigma^6$, and the Pearson skewness coefficient is defined as $(\mu-M)/\sigma$. The skewness and skewness coefficient are proportional, i.e., $(\mu-M)/\sigma \propto \mu_3^2/\sigma^6$. Thus, it can be shown $$[\mu(S)-M(S)]/\sigma(S) = K_S[\mu_3^2(S)/\sigma^6(S)], \text{ and}$$

$$[\mu(R)-M(R)]/\sigma(R) = K_R[\mu_3^2(R)/\sigma^6(R)],$$

where K is the constant of proportionality.

Since a symmetric input waveform has zero skewness, or $\mu_3(I)=0$, the previous equation for the third central moment reduces to $\mu_3(S)=\mu_3(R)$. An input waveform with zero skewness also implies that $M(I)=\mu(I)$. Hence, from the equation for the estimated delay D(R), it can be shown that $$\mu(R)-M(R)=[\mu(S)+\mu(I)]-[D(R)+M(I)]=\mu(S)-D(R)$$

Accordingly, the foregoing equation derived from skewness becomes $$[\mu(S)-D(R)]/\sigma(R) = K_R[\mu_3^2(S)/\sigma^6(R)].$$

This equation can be further manipulated by assuming that the constants of proportionality $K_S$ and $K_R$ are equal. While this assumption can introduce error into the PERI technique, these values in general are quite close as the relationship between skewness and the skewness coefficient are similar across similar-looking PDFs. Dividing this last equation by the first skewness derived equation (while assuming $K_S=K_R$) yields:

$$[\mu(S)-D(R)]/[\mu(S)-M(S)]=[\sigma(S)/\sigma(R)]^5.$$

If the constant $\sigma^5(S)/\sigma^5(R)$ is denoted as $\alpha$, then this equation can be solved for $D(R)$ to result in the delay estimate for the ramp response $$D(R)=(1-\alpha)\mu(S)+\alpha M(S).$$

Given the relationships between the standard deviations and circuit moments, for a ramp input response with slope T the value of $\alpha$ is given by $$\alpha=[(2\ m_2-m_1^2)/(2\ m_2-m_1^2+T^2/12)]^{5/2}.$$

Several interesting observations can be made regarding the PERI technique. Recalling that $\sigma^2(R)=\sigma^2(S)+\sigma^2(I)$, the value of the constant $\alpha$ must lie between zero and one. Thus, $\alpha$ reflects the amount of trade-off between the Elmore delay $\mu(S)$ and the step delay metric $M(S)$. It can also be shown that, for a step input (T=0), $\alpha=1$ and thus $D(R)$ equals the step delay metric $M(S)$. Conversely, for infinitely slow ramps (T→∞), $\alpha$→0 and thus $D(R)$ approaches the Elmore delay, which has been shown to be the upper limit on delay. Accordingly, the PERI technique has the desired asymptotic behavior. The equation for the delay estimate for the ramp response is valid for extending any delay metric.

The PERI technique may also be adapted for slew metrics. Slew is a single measure for how fast the output waveform rises to $V_{dd}$. Since the CDF may asymptotically approach $V_{dd}$ without actually reaching it, a commonly used definition of slew is the 10/90 slew, i.e., the time difference between when the waveform crosses the 90% point and the 10% point. The slowly climbing tail of the output waveform may necessitate an even tighter slew definition, e.g., 30/70.

The output slew is proportional to its standard deviation. For the convolution approach, this means that $Slew(S)=C_S\sigma(S)$, $Slew(I)=C_S\sigma(I)$, and $Slew(R)=C_S\sigma(R)$, where C is the constant of proportionality. From the sum of the squares rule for standard deviations, the slews are related by the equation $$[Slew(R)/C_R]^2=[Slew(S)/C_S]^2+[Slew(I)/C_I]^2.$$

As with the delay estimate, it can again be assumed that the constants of proportionality are identical. While in reality the constants of proportionality are not all the same, experimental results show that only a small error is incurred by this assumption. This assumption leads to the estimation method for ramp slew as $$Slew(R)=\sqrt{Slew^2(S)+Slew^2(I)}.$$

In other words, the output slew is approximately the root-mean square of the step slew and input slew. This result can also be applied for any slew measurement, 10/90, 30/70, etc., as long as all three slews are measured using the same criteria. As noted above, the CDF may never reach $V_{dd}$ so different slew definitions can be used which refer to the time delay between the waveform crossing a first (low) voltage threshold and then crossing a second (high) voltage threshold. For example, in the ramp waveform of FIG. 4 wherein the voltage transition has a constant slope reaching $V_{dd}$ over a period of time T, Slew(I)=0.8T for 10/90 slew, and 0.4T for 30/70 slew. This formula for ramp slew exhibits the correct limiting behavior: as Slew(I)→∞, Slew(R)→∞ and, as Slew(I)→0, Slew(R)→Slew(S). This approach can be used with any step slew metric.

To further understand the PERI technique, consider the example of an RC circuit such as that shown in FIG. 1, which has only five nodes, and the following resistor and capacitor values: $R_1$=0.479 kΩ, $C_1$=11.1 ff; $R_2$=0.337 kΩ, $C_2$=15.9 ff; $R_3$=0.0.233 kΩ, $C_3$=18.6 ff; $R_4$=0.520 kΩ, $C_4$=14.6 ff; and $R_5$=0.285 kΩ, $C_5$=8.7 ff. The desired values are the delay and slew at the last node ($N_5$). The first two circuit moments of this node are $m_1$=−76.96 and $m_2$=5029.18. Though any delay metric can be used to derive $M(S)$, to show the effectiveness of PERI the actual delay $M(S)$=58.01 ps, as computed by RICE, is used for this example. Since $\mu(S)=-m_1$, the ramp delay from the PERI technique reduces to $D(R)$=76.96−18.95α. One can see that when α=0, the ramp delay equals the Elmore delay, corresponding to an infinite input ramp. When α=1, the ramp delay equals the step delay. For all other values of α, the ramp delay lies between these two extremes. For example, taking a saturated ramp input of T=100 ps, α becomes 0.6319, yielding a value $D(R)$=64.99 ps. The actual delay value is 63.90. Alternatively, an input ramp with T=200 ps, yields α=s 0.2281 and a corresponding delay $D(R)$=72.64 ps. The actual delay is 71.59 ps. Thus, for both input slews, the PERI delay method (which can be computed quickly from just two circuit moments) has relative error of less than two percent.

To find the ramp output slew at node 5 for this example, the actual value for the step slew is used. For T=100 ps, the 10/90 slew is Slew(I)=80 ps, and Slew(S)=142.2 ps (using RICE). Using the root mean-square formula yields an output slew of Slew(R)=163.2 ps. The actual 10/90 output slew is 165.2 ps, which is again less than a two percent relative error.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims

What is claimed is:

1. A method of determining a circuit response from a ramp input of a resistive-capacitive (RC) circuit, comprising the steps of:
    calculating a first circuit response parameter using a given circuit response metric based on a step input for the RC circuit, wherein the circuit response metric is selected from a slew metric and a delay metric;
    calculating a second circuit response parameter, different from the first circuit response parameter, using the same circuit response metric based on a step input for the RC circuit; and
    extending the circuit response metric to the ramp input of the RC circuit by combining the first and second circuit response parameters to yield an estimated ramp response.

2. The method of claim 1 wherein said calculating steps derive the first and second circuit response parameters from a statistical distribution function.

3. The method of claim 2 wherein at least one of the first and second circuit response parameters is derived from a standard deviation of a probability distribution function corresponding to the circuit response parameter.

4. The method of claim 2 wherein at least one of the first and second circuit response parameters is derived from a mean of a probability distribution function corresponding to the circuit response parameter.

5. The method of claim 1 wherein:
said step of calculating the first circuit response parameter calculates a step slew;
said step of calculating the second circuit response parameter calculates an input slew; and
said step of extending the circuit response metric combines the step slew and input slew to yield an estimated output slew for the ramp input of the RC circuit.

6. The method of claim 5 wherein said step of extending the circuit response metric further combines the step slew (Slew(S)) and input slew (Slew(I)) to yield the estimated output slew (Slew(R)) according to the formula $$\text{Slew}(R)=\sqrt{\text{Slew}^2(S)+\text{Slew}^2(I)}.$$

7. The method of claim 1 wherein:
said step of calculating the first circuit response parameter calculates a mean value for delay step response;
said step of calculating the second circuit response parameter calculates a median value for delay step response; and
said step of extending the circuit response metric combines the mean and median values for delay step response to yield an estimated delay for the ramp input of the RC circuit.

8. The method of claim 7 wherein said step of extending the circuit response metric further combines the mean value for delay step response ($\mu(S)$) and the median value for delay step response (M(S)) to yield the estimated delay (D(R)) according to the formula $$D(R)=(1-\alpha)\mu(S)+\alpha M(S),$$

where $\alpha$ is a constant based on the standard deviations of the delay step response and an input waveform.

9. A data processing system for determining a circuit response from a ramp input of a resistive-capacitive (RC) circuit, comprising:
means for processing program instructions;
a memory device connected to said processing means; and
program instructions stored in said memory device for calculating a first circuit response parameter using a given circuit response metric based on a step input for the RC circuit, wherein the given circuit response metric is selected from a slew metric and a delay metric, calculating a second circuit response parameter different from the first circuit response parameter using the same circuit response metric based on a step input for the RC circuit, and extending the circuit response metric to the ramp input of the RC circuit by combining the first and second circuit response parameters to yield an estimated ramp response.

10. The data processing system of claim 9 wherein said program instructions derive the first and second circuit response parameters from a statistical distribution function.

11. The data processing system of claim 10 wherein at least one of the first and second circuit response parameters is derived from a standard deviation of a probability distribution function corresponding to the circuit response parameter.

12. The data processing system of claim 10 wherein at least one of the first and second circuit response parameters is derived from a mean of a probability distribution function corresponding to the circuit response parameter.

13. The data processing system of claim 9 wherein:
said program instructions calculate the first circuit response parameter by calculating a step slew;
said program instructions calculate the second circuit response parameter by calculating an input slew; and
said program instructions combine the step slew and input slew to yield an estimated output slew for the ramp input of the RC circuit.

14. The data processing system of claim 13 wherein said program instructions further combine the step slew (Slew(S)) and input slew (Slew(I)) to yield the estimated output slew (Slew(R)) according to the formula $$\text{Slew}(R)=\sqrt{\text{Slew}^2(S)+\text{Slew}^2(I)}.$$

15. The data processing system of claim 9 wherein:
said program instructions calculate the first circuit response parameter by calculating a mean value for delay step response;
said program instructions calculate the second circuit response parameter by calculating a median value for delay step response; and
said program instructions combine the mean and median values for delay step response to yield an estimated delay for the ramp input of the RC circuit.

16. The data processing system of claim 15 wherein said program instructions further combine the mean value for delay step response ($\mu(S)$) and the median value for delay step response (M(S)) to yield the estimated delay (D(R)) according to the formula $$D(R)=(1-\alpha)\mu(S)+\alpha M(S),$$

where $\alpha$ is a constant based on the standard deviations of the delay step response and an input waveform.

17. A computer program product for determining a circuit response from a ramp input of a resistive-capacitive (RC) circuit, comprising:
a computer-readable medium; and
program instructions residing in said medium for calculating a first circuit response parameter using a given circuit response metric based on a step input for the RC circuit, wherein the given circuit response metric is selected from a slew metric and a delay metric, calculating a second circuit response parameter different from the first circuit response parameter using the same circuit response metric based on a step input for the RC circuit, and extending the circuit response metric to the ramp input of the RC circuit by combining the first and second circuit response parameters to yield an estimated ramp response.

18. The computer program product of claim 17 wherein said program instructions derive the first and second circuit response parameters from a statistical distribution function.

19. The computer program product of claim 18 wherein at least one of the first and second circuit response parameters is derived from a standard deviation of a probability distribution function corresponding to the circuit response parameter.

20. The computer program product of claim 18 wherein at least one of the first and second circuit response parameters is derived from a mean of a probability distribution function corresponding to the circuit response parameter.

21. The computer program product of claim 17 wherein:

said program instructions calculate the first circuit response parameter by calculating a step slew;

said program instructions calculate the second circuit response parameter by calculating an input slew; and said program instructions combine the step slew and input slew to yield an estimated output slew for the ramp input of the RC circuit.

22. The computer program product of claim 21 wherein said program instructions further combine the step slew (Slew(S)) and input slew (Slew(I)) to yield the estimated output slew (Slew(R)) according to the formula $$\mathrm{Slew}(R)=\sqrt{\mathrm{Slew}^2(S)+\mathrm{Slew}^2(I)}.$$

23. The computer program product of claim 17 wherein:

said program instructions calculate the first circuit response parameter by calculating a mean value for delay step response;

said program instructions calculate the second circuit response parameter by calculating a median value for delay step response; and said program instructions combine the mean and median values for delay step response to yield an estimated delay for the ramp input of the RC circuit.

24. The computer program product of claim 23 wherein said program instructions further combine the mean value for delay step response ($\mu(S)$) and the median value for delay step response (M(S)) to yield the estimated delay (D(R)) according to the formula $$D(R)=(1-\alpha)\mu(S)+\alpha M(S),$$

where $\alpha$ is a constant based on the standard deviations of the delay step response and an input waveform.

* * * * *